US012811369B2

(12) United States Patent
Watanabe et al.

(10) Patent No.: US 12,811,369 B2

(45) Date of Patent: Nov. 24, 2026

(54) SURFACE-EMITTING LASER AND METHOD FOR MANUFACTURING SURFACE-EMITTING LASER

(71) Applicant: SONY GROUP CORPORATION, Tokyo (JP)

(72) Inventors: Tomomasa Watanabe, Tokyo (JP); Hiroshi Nakajima, Tokyo (JP); Masayuki Tanaka, Tokyo (JP); Mikihiro Yokozeki, Tokyo (JP)

(73) Assignee: Sony Group Corporation, Tokyo (JP)

( * ) Notice: Subject to any disclaimer, the term of this patent is extended or adjusted under 35 U.S.C. 154(b) by 612 days.

(21) Appl. No.: 18/277,496

(22) PCT Filed: Jan. 12, 2022

(86) PCT No.: PCT/JP2022/000645

§ 371 (c)(1),
(2) Date: Aug. 16, 2023

(87) PCT Pub. No.: WO2022/181085

PCT Pub. Date: Sep. 1, 2022

(65) Prior Publication Data

US 2024/0305064 A1 Sep. 12, 2024

(30) Foreign Application Priority Data

Feb. 26, 2021 (JP) ................................ 2021-029924

(51) Int. Cl.
*H01S 5/183* (2006.01)
*H01S 5/042* (2006.01)
(Continued)

(52) U.S. Cl.
CPC ...... *H01S 5/18377* (2013.01); *H01S 5/04253* (2019.08); *H01S 5/18308* (2013.01);
(Continued)

(58) Field of Classification Search
CPC ............ H01S 5/18377; H01S 5/04253; H01S 5/18308; H01S 5/18311; H01S 5/18369; H01S 5/3416; H01S 5/423; H01S 5/0217
See application file for complete search history.

(56) References Cited

U.S. PATENT DOCUMENTS 6,549,556 B1 * 4/2003 Hwang .............. H01S 5/18341 372/96
2006/0203867 A1 9/2006 Imai
(Continued)

FOREIGN PATENT DOCUMENTS

JP 2005-158922 A 6/2005
JP 2006-253235 A 9/2006
(Continued)

OTHER PUBLICATIONS

International Search Report issued in International Patent Application No. PCT/JP2022/000645 on Feb. 15, 2022 and English translation of same. 7 pages.
(Continued)

*Primary Examiner* — Yuanda Zhang
(74) *Attorney, Agent, or Firm* — K&L Gates LLP

(57) ABSTRACT

To provide a surface-emitting laser that can achieve further reduction of diffraction loss, further improvement of heat dissipation, further improvement of yield, and further improvement of reliability.
To provide a surface-emitting laser including a substrate and a vertical resonator structure formed on the substrate, in which the vertical resonator structure includes at least one element selected from the group consisting of In, Ga, Al, N, As, and P, and includes at least an active layer, an upper DBR layer, a lower DBR layer, the upper DBR layer and the lower DBR layer are formed with the active layer interposed therebetween, and the lower DBR layer includes at least one transparent conductive layer that contains a transparent conductive material including a non III-V semiconductor.

19 Claims, 12 Drawing Sheets

(51) Int. Cl.
*H01S 5/34* (2006.01)
*H01S 5/42* (2006.01)
*H01S 5/02* (2006.01)
*H01S 5/343* (2006.01)

(52) U.S. Cl.
CPC ...... *H01S 5/18311* (2013.01); *H01S 5/18369* (2013.01); *H01S 5/3416* (2013.01); *H01S 5/423* (2013.01); *H01S 5/0217* (2013.01); *H01S 5/343* (2013.01)

(56) References Cited

U.S. PATENT DOCUMENTS

| | | | |
|---|---|---|---|
| 2010/0098127 A1 | 4/2010 | Higuchi et al. | |
| 2011/0261849 A1 | 10/2011 | Shinagawa et al. | |
| 2011/0280269 A1* | 11/2011 | Chang-Hasnain | H01S 5/18366 372/50.1 |
| 2021/0044087 A1 | 2/2021 | Arakida et al. | |

FOREIGN PATENT DOCUMENTS

| | | | |
|---|---|---|---|
| JP | 2008-108827 | A | 5/2008 |
| JP | 2008-283129 | A | 11/2008 |
| JP | 2010-056235 | A | 3/2010 |
| JP | UP2010-123921 | A | 6/2010 |
| JP | 2011-205076 | A | 10/2011 |
| JP | 2011-238852 | A | 11/2011 |
| JP | 2012-049292 | A | 3/2012 |
| JP | 2017-092204 | A | 5/2017 |
| WO | WO2019/171869 | A1 | 9/2019 |
| WO | WO2020/026573 | A1 | 2/2020 |

OTHER PUBLICATIONS

Written opinion issued in International Patent Application No. PCT/JP2022/000645 on Feb. 15, 2022. 4 pages.

* cited by examiner

A

B

A

B

A

B

A

B

A

B

SURFACE-EMITTING LASER AND METHOD FOR MANUFACTURING SURFACE-EMITTING LASER

TECHNICAL FIELD

The present technique relates to a surface-emitting laser and a method for manufacturing the surface-emitting laser.

BACKGROUND ART

A surface-emitting laser (surface-emitting semiconductor laser) has various advantages as compared with an edge-emitting laser (edge-emitting semiconductor laser). Thus, surface-emitting lasers have been actively researched and developed in recent years (for example, Patent Documents 1 to 3). Then, examples of the surface-emitting lasers include a vertical cavity surface emitting laser (VCSEL).

CITATION LIST

Patent Document

Patent Document 1: Japanese Patent Application Laid-Open No. 2008-108827

Patent Document 2: Japanese Patent Application Laid-Open No. 2012-049292

Patent Document 3: Japanese Patent Application Laid-Open No. 2005-158922

SUMMARY OF THE INVENTION

Problems to be Solved by the Invention

However, the technique proposed in Patent Documents 1 to 3 may not be able to achieve further reduction of diffraction loss, further improvement of heat dissipation, further improvement of yield, and further improvement of reliability.

Therefore, the present technique has been made in view of such a situation, and a main object thereof is to provide a surface-emitting laser and a method for manufacturing the surface-emitting laser capable of further reducing diffraction loss, further improving heat dissipation, further improving yield, and further improving reliability.

Solutions to Problems

As a result of intensive studies to achieve the above object, the present inventors have surprisingly succeeded in further reducing diffraction loss, further improving heat dissipation, further improving yield, and further improving reliability, and have completed the present technique.

That is, the present technique provides, as a first aspect, a surface-emitting laser including a substrate and a vertical resonator structure formed on the substrate, in which the vertical resonator structure includes at least one element selected from a group consisting of In, Ga, Al, N, As, and P, and includes at least an active layer, an upper DBR layer, and a lower DBR layer, the upper DBR layer and the lower DBR layer are formed with the active layer interposed therebetween, and the lower DBR layer includes at least one transparent conductive layer that contains a transparent conductive material including a non III-V semiconductor.

In the surface-emitting laser of the first aspect according to the present technique, the transparent conductive layer may be transparent to an emission wavelength, and may transmits light of a predetermined emission wavelength or of a predetermined emission wavelength band.

In the surface-emitting laser of the first aspect according to the present technique, the transparent conductive layer may have a film thickness of $\lambda/4n$ ($\lambda$ is an emission wavelength, and n is a refractive index of the transparent conductive material), and the transparent conductive material may include ITiO, ITO, ZnO, AZO, or IGZO.

In the surface-emitting laser of the first aspect according to the present technique, the lower DBR layer may further include a metal layer and a dielectric layer in this order from a side of the substrate.

In the surface-emitting laser of the first aspect according to the present technique, the lower DBR layer may further includes a metal layer and a dielectric layer in this order from a side of the substrate, the dielectric layer may be formed by alternately laminating a first dielectric layer and a second dielectric layer, the first dielectric layer may contain a first dielectric material, the second dielectric layer may contain a second dielectric material, the first dielectric layer may have a film thickness of $\lambda/4n1$ ($\lambda$ is an emission wavelength, and n1 is a refractive index of the first dielectric material), and the second dielectric layer may have a film thickness of $\lambda/4n2$ ($\lambda$ is an emission wavelength, and n2 is a refractive index of the second dielectric material).

In the surface-emitting laser of the first aspect according to the present technique, the lower DBR layer may further include a semiconductor epitaxial layer (epitaxially grown layer).

In the surface-emitting laser of the first aspect according to the present technique, an oxide confinement structure may be formed in a region between the upper DBR layer and the active layer and outside a lower region of the upper DBR layer.

In the surface-emitting laser of the first aspect according to the present technique, a current confinement structure via tunnel junction may be formed in a region between the upper DBR layer and the active layer and outside a lower region of the upper DBR layer.

In the surface-emitting laser of the first aspect according to the present technique, a current confinement structure via ion implantation may be formed in a region between the upper DBR layer and the active layer and outside a lower region of the upper DBR layer.

In the surface-emitting laser of the first aspect according to the present technique, an optical confinement structure may be formed under the substrate, and the optical confinement structure may include a concave mirror.

In the surface-emitting laser of the first aspect according to the present technique, an oxide confinement structure, a current confinement structure via tunnel junction, or a current confinement structure via ion implantation may be formed in a region between the active layer and the lower DBR layer and outside a lower region of the upper DBR layer.

In the surface-emitting laser of the first aspect according to the present technique, the active layer may include a III-V semiconductor.

In the surface-emitting laser of the first aspect according to the present technique, the lower DBR layer may include a dielectric layer, and the upper DBR layer may include a dielectric layer and a metal layer in this order from a side of the substrate.

In the surface-emitting laser of the first aspect according to the present technique, the vertical resonator structure may include a plurality of the upper DBR layers, and the plurality of DBR layers may be formed in an array.

In the surface-emitting laser of the first aspect according to the present technique, the substrate may include a Si circuit substrate, and the surface-emitting laser of the first aspect according to the present technique may be independently driven.

The present technique provides, as a second aspect, a surface-emitting laser including a substrate and a vertical resonator structure formed on the substrate, in which the vertical resonator structure includes at least one element selected from a group consisting of In, Ga, Al, N, As, and P, and includes at least an active layer, an upper DBR layer, a lower DBR layer, an upper electrode, and a lower electrode, the upper DBR layer and the lower DBR layer are formed with the active layer interposed therebetween, the upper electrode and the lower electrode are formed with the active layer interposed therebetween, the lower DBR layer includes at least one transparent conductive layer that contains a transparent conductive material including a non III-V semiconductor, the transparent conductive layer includes a contact region in contact with the lower electrode, and the surface-emitting laser includes an intracavity structure.

In the surface-emitting laser of the second aspect according to the present technique, the transparent conductive layer may be transparent to an emission wavelength, and may transmits light of a predetermined emission wavelength or of a predetermined emission wavelength band.

In the surface-emitting laser of the second aspect according to the present technique, the transparent conductive layer may have a film thickness of $\lambda/4n$ ($\lambda$ is an emission wavelength, and n is a refractive index of the transparent conductive material), and the transparent conductive material may include ITiO, ITO, ZnO, AZO, or IGZO.

In the surface-emitting laser of the second aspect according to the present technique, the lower DBR layer may further include a metal layer and a dielectric layer in this order from a side of the substrate.

In the surface-emitting laser of the second aspect according to the present technique, the lower DBR layer may further includes a metal layer and a dielectric layer in this order from a side of the substrate, the dielectric layer may be formed by alternately laminating a first dielectric layer and a second dielectric layer, the first dielectric layer may contain a first dielectric material, the second dielectric layer may contain a second dielectric material, the first dielectric layer may have a film thickness of $\lambda/4n1$ ($\lambda$ is an emission wavelength, and n1 is a refractive index of the first dielectric material), and the second dielectric layer may have a film thickness of $\lambda/4n2$ ($\lambda$ is an emission wavelength, and n2 is a refractive index of the second dielectric material).

In the surface-emitting laser of the second aspect according to the present technique, the lower DBR layer may further include a semiconductor epitaxial layer (epitaxially grown layer).

In the surface-emitting laser of the second aspect according to the present technique, an oxide confinement structure may be formed in a region between the upper DBR layer and the active layer and outside a lower region of the upper DBR layer.

In the surface-emitting laser of the second aspect according to the present technique, a current confinement structure via tunnel junction may be formed in a region between the upper DBR layer and the active layer and outside a lower region of the upper DBR layer.

In the surface-emitting laser of the second aspect according to the present technique, a current confinement structure via ion implantation may be formed in a region between the upper DBR layer and the active layer and outside a lower region of the upper DBR layer.

In the surface-emitting laser of the second aspect according to the present technique, an optical confinement structure may be formed under the substrate, and the optical confinement structure may include a concave mirror.

In the surface-emitting laser of the second aspect according to the present technique, an oxide confinement structure, a current confinement structure via tunnel junction, or a current confinement structure via ion implantation may be formed in a region between the active layer and the lower DBR layer and outside a lower region of the upper DBR layer.

In the surface-emitting laser of the second aspect according to the present technique, the active layer may include a III-V semiconductor.

In the surface-emitting laser of the second aspect according to the present technique, the lower DBR layer may include a dielectric layer, and the upper DBR layer may include a dielectric layer and a metal layer in this order from a side of the substrate.

In the surface-emitting laser of the second aspect according to the present technique, the vertical resonator structure may include a plurality of the upper DBR layers, and the plurality of DBR layers may be formed in an array.

In the surface-emitting laser of the second aspect according to the present technique, the substrate may include a Si circuit substrate, and the surface-emitting laser of the second aspect according to the present technique may be independently driven.

The present technique provides, as a third aspect, a method for manufacturing a surface-emitting laser including forming a first substrate provided with an active layer, forming, on the first substrate, a lower DBR layer including at least a transparent conductive layer containing a transparent conductive material that transmits light of a specific wavelength and a dielectric layer containing a dielectric material, bonding a second substrate to the lower DBR layer, and removing the first substrate to form an upper DBR layer including at least a confinement structure, an electrode structure, and a dielectric layer containing a dielectric material.

According to the present technique, further reduction of diffraction loss, further improvement of heat dissipation, further improvement of yield, and further improvement of reliability can be achieved. Note that the effects described here are not necessarily limited, and may be any effect described in the present disclosure.

MODE FOR CARRYING OUT THE INVENTION

Figure 1:
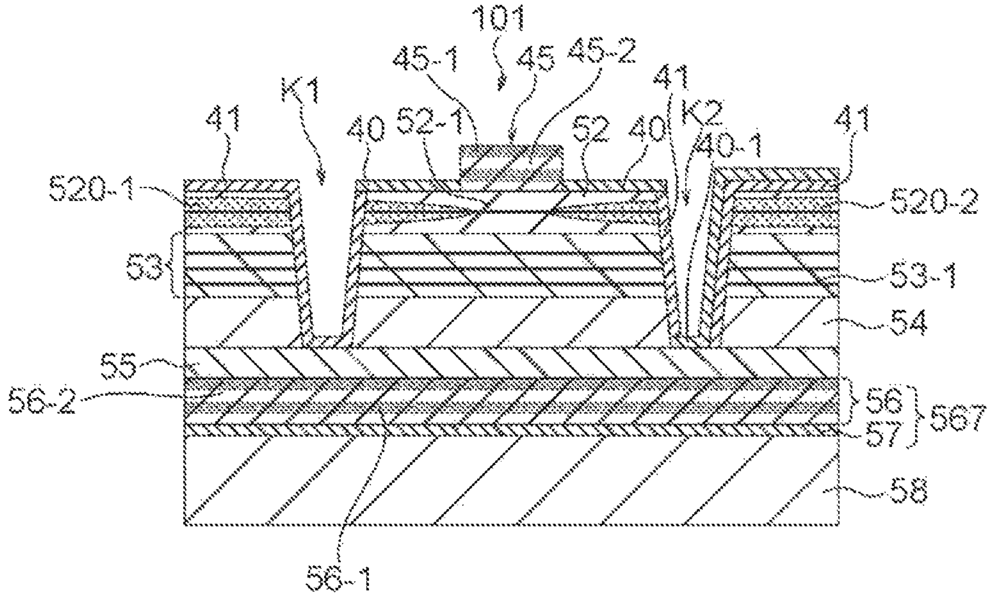
FIG. 1 is a diagram illustrating a configuration example of a surface-emitting laser of a first embodiment to which the present technique is applied.

Hereinafter, preferred modes for carrying out the present technique will be described. Embodiments to be described below illustrates examples of representative embodiments of the present technique, and the scope of the present technique is not narrowed by them. Note that unless otherwise specified, in the drawings, "upper" means an upper direction or an upper side in the drawings, "lower" means a lower direction or a lower side in the drawings, "left" means a left direction or a left side in the drawings, and "right" means a right direction or a right side in the drawings. Furthermore, in the description using the drawings, the same or equivalent elements or members are designated by the same reference signs, and duplicate descriptions will be omitted unless there is a special circumstance.

Note that the description will be given in the following order.

1. Overview of Present Technique
2. First Embodiment (Example 1 of Surface-Emitting Laser)
3. Second Embodiment (Example 2 of Surface-Emitting Laser)
4. Third Embodiment (Example 3 of Surface-Emitting Laser)
5. Fourth Embodiment (Example 4 of Surface-Emitting Laser)
6. Fifth Embodiment (Example 5 of Surface-Emitting Laser)
7. Sixth Embodiment (Example 6 of Surface-Emitting Laser)
8. Seventh Embodiment (Example 7 of Surface-Emitting Laser)
9. Eighth Embodiment (Example 8 of Surface-Emitting Laser)
10. Ninth Embodiment (Example 9 of Surface-Emitting Laser)
11. Tenth Embodiment (Example 10 of Surface-Emitting Laser)
12. Eleventh Embodiment (Example 11 of Surface-Emitting Laser)
13. Twelfth Embodiment (Example 1 of Method for Manufacturing Surface-Emitting Laser)

1. Overview of Present Technique

First, an overview of the present technique will be described. The present technique relates to a surface-emitting laser and a method for manufacturing the surface-emitting laser.

In InP-based VCSELs, a structure that includes a DBR containing a semiconductor formed on one side and a DBR containing dielectric/metal formed on the other side has been put into practical use. This structure, in which the light is emitted from the side of the semiconductor DBR, may create absorption loss due to doping of the semiconductor DBR since current is applied in the vertical direction from the upper and lower electrodes, and thus may reduce efficiency (PCE).

Meanwhile, in order to improve heat dissipation, a technique is known in which a semiconductor DBR is formed on a substrate containing different materials (GaAs) and then wafer bonded with an InP-based material. However, when current is applied to the bonding interface, reliability may be reduced due to high resistance of the bonding interface.

In order to avoid the two issues above, an intracavity structure is considered to be the most suitable structure. However, the conventional intracavity structure has poor heat dissipation, creates absorption and diffraction loss, requires accurate etching up to a lower semiconductor contact layer, and the like, and thus has failed to solve the two issues above.

The present technique has been made in view of such a situation above. The present technique enables a VCSEL to have intracavity structure with less diffraction loss, better heat dissipation and better yield than the conventional intracavity structure by forming conductive material including a non III-V semiconductor that is transparent to a wavelength of light on and/or in a part of a DBR mirror layer disposed between a substrate and an active layer. In addition, the present technique does not adopt a structure in which current flows through the bonding interface, and thus contributes to improvement of reliability.

Then, the present technique includes at least the following advantages.

- The present technique includes thinner film thickness of the contact layer (shorter cavity length) and thus can reduce the diffraction loss unlike the conventional intracavity structure.
- With the present technique, heat conduction is improved as compared with the InP-based epitaxial DBR, and the heat dissipation is improved accordingly. This improvement contributes to higher output as compared with the conventional intracavity structure.
- ITiO and the like used in the present technique do not absorb free carriers in the eye safe wavelength band, and have high compatibility (small wavelength dispersion) with other materials used in DBR, so that the degree of freedom in DBR mirror design can be increased.
- The present technique can reduce the manufacturing cost since Si and the like can be manufactured with a large diameter size.
- The present technique has high affinity with Si photonics.
- The present technique makes application development to a TOF module, a package, and the like easier.
- The present technique can independently drive the array emitting element when combined with the circuit substrate.
- The present technique includes an intracavity structure in which no current flows through the bonding interface, enabling improvement of reliability.

The above description is an overview of the present technique. Hereinafter, preferred embodiments for carrying out the present technique will be described specifically and in detail with reference to the drawings. Embodiments to be described below illustrates examples of representative embodiments of the present technique, and the scope of the present technique is not narrowed by them.

2. First Embodiment (Example 1 of Surface-Emitting Laser)

A surface-emitting laser of a first embodiment (example 1 of a surface-emitting laser) according to the present technique will be described with reference to FIG. 1.

FIG. 1 is a diagram illustrating a configuration example of the surface-emitting laser of the first embodiment according to the present technique, and specifically, is a cross-sectional view illustrating a surface-emitting laser 101.

The surface-emitting laser 101 includes a substrate 58 and a vertical resonator structure formed on the substrate 58. The vertical resonator structure includes at least one element selected from the group consisting of In, Ga, Al, N, As, and P, and includes at least an active layer 53 in which a quantum well layer 53-1 is formed, an upper DBR layer 45, a lower DBR layer, an upper electrode 40, and a lower electrode 40-1. The lower DBR layer includes a hybrid mirror 567 and an ITiO layer 55 in this order from the side of the substrate 58.

The ITiO layer 55 included in the surface-emitting laser 101 may alternatively be, for example, an ITO layer, a ZnO layer, an AZO layer, an IGZO layer, or the like. This alternative may also be applied to surface-emitting lasers 102-111 and 117 to be described below.

As illustrated in FIG. 1, the upper DBR layer 45 and the lower DBR layer are formed with the active layer 53 interposed therebetween, and the upper electrode 40 and the lower electrode 40-1 are formed with the active layer interposed therebetween (via an opening K2). The ITiO layer 55 includes a contact region in contact with the lower electrode 40-1.

In the surface-emitting laser 101, the ITio layer 55 containing transparent conductive material (ITiO) is formed on a hybrid mirror 567 disposed between the substrate (Si substrate) 58 and the active layer 53. The ITiO layer 55 constitutes one of the layers in the lower DBR layer and serves as the contact layer in contact with the lower electrode 40-1. By forming the ITiO layer 55, both the electrode and the lower DBR layer can be achieved.

According to the surface-emitting laser 101, diffraction loss is reduced and heat dissipation is improved as compared with the conventional techniques. Examples of the transparent conductive material include ITO, Zno, AZO, IGZO, and the like in addition to ITiO. Examples of the substrate include a SiC substrate, a GaAs substrate, and the like in addition to the Si substrate.

As described above, the content described for the surface-emitting laser of the first embodiment (example 1 of the surface-emitting laser) according to the present technique can be applied to surface-emitting lasers of second to eleventh embodiments according to the present technique to be described below and a method for manufacturing a surface-emitting laser of a twelfth embodiment to be described below unless there is a particular technical contradiction.

3. Second Embodiment (Example 2 of Surface-Emitting Laser)

A surface-emitting laser of a second embodiment (example 2 of a surface-emitting laser) according to the present technique will be described with reference to FIG. 2.

Figure 2:
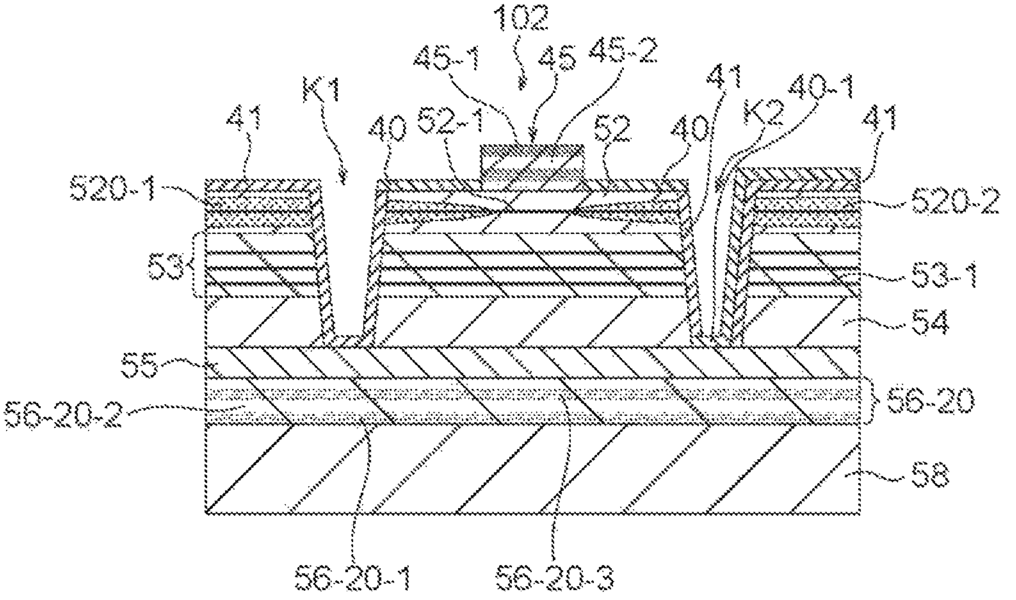
FIG. 2 is a diagram illustrating a configuration example of a surface-emitting laser of a second embodiment to which the present technique is applied.

FIG. 2 is a diagram illustrating a configuration example of the surface-emitting laser of the second embodiment according to the present technique, and specifically, is a cross-sectional view illustrating a surface-emitting laser 102.

The surface-emitting laser 102 includes a substrate 58 and a vertical resonator structure formed on the substrate 58. The vertical resonator structure includes at least one element selected from the group consisting of In, Ga, Al, N, As, and P, and includes at least an active layer 53, an upper DBR layer 45, a lower DBR layer, an upper electrode 40, and a lower electrode 40-1. The lower DBR layer includes a GaAs epitaxial DBR mirror 56-20 and an ITiO layer 55 in this order from the side of the substrate 58.

As described above, the GaAs epitaxial DBR mirror 56-20 is used in the surface-emitting laser 102 illustrated in FIG. 2 instead of the hybrid mirror 567 included in the surface-emitting laser 101 illustrated in FIG. 1. By forming the GaAs epitaxial DBR mirror, an effect of further improvement of heat dissipation is also added. AlAs, AlGaAs, and GaAs are used to form the GaAs epitaxial DBR. InP, AlGaInAs, and AlInAs are used to form the InP epitaxial DBR. In the present embodiment, wafer bonding is performed on the transparent conductive material ITiO.

As described above, the content described for the surface-emitting laser of the second embodiment (example 2 of the surface-emitting laser) according to the present technique can be applied to the surface-emitting laser of the first embodiment according to the present technique described above, surface-emitting lasers of third to eleventh embodiments according to the present technique to be described below and a method for manufacturing a surface-emitting laser of a twelfth embodiment to be described below unless there is a particular technical contradiction.

4. Third Embodiment (Example 3 of Surface-Emitting Laser)

A surface-emitting laser of a third embodiment (example 3 of a surface-emitting laser) according to the present technique will be described with reference to FIG. 3.

Figure 3:
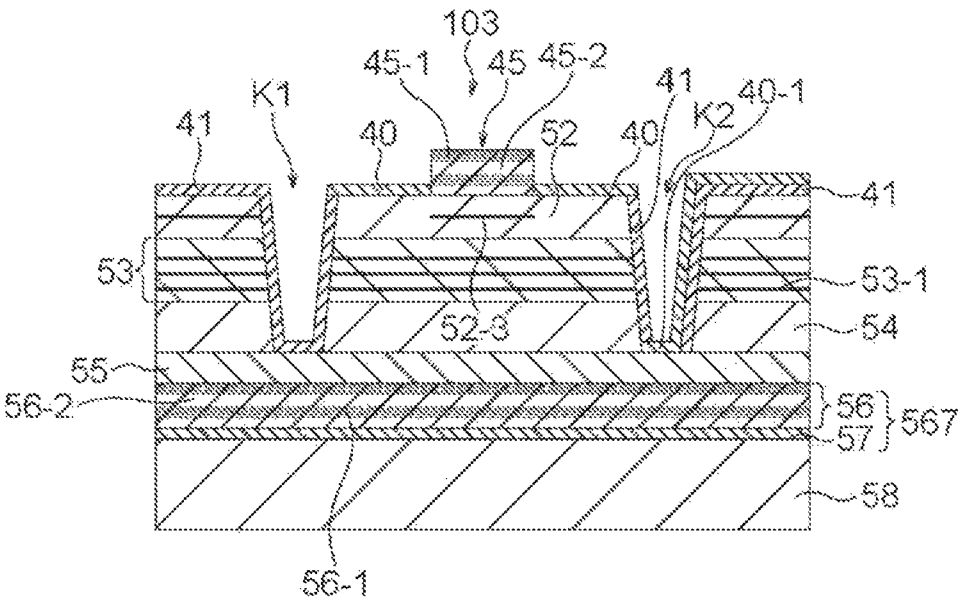
FIG. 3 is a diagram illustrating a configuration example of a surface-emitting laser of a third embodiment to which the present technique is applied.

FIG. 3 is a diagram illustrating a configuration example of the surface-emitting laser of the third embodiment according to the present technique, and specifically, is a cross-sectional view illustrating a surface-emitting laser 103.

The surface-emitting laser 103 includes a substrate 58 and a vertical resonator structure formed on the substrate 58. The vertical resonator structure includes at least one element selected from the group consisting of In, Ga, Al, N, As, and P, and includes at least an active layer 53, an upper DBR layer 45, a lower DBR layer, an upper electrode 40, and a lower electrode 40-1. The lower DBR layer includes a hybrid mirror 567 and an ITiO layer 55 in this order from the side of the substrate 58.

The surface-emitting laser 103 illustrated in FIG. 3 includes a tunnel junction (TJ) buried structure 52-3 in an upper cladding layer 52 as a confinement method. The tunnel junction (TJ) contains AlGaInAs, AlInAs, InGaAs, InP, InGaAsP, or the like. Burying is regrown on InP.

As described above, the content described for the surface-emitting laser of the third embodiment (example 3 of the surface-emitting laser) according to the present technique can be applied to the surface-emitting lasers of the first and second embodiments according to the present technique described above, surface-emitting lasers of fourth to eleventh embodiments according to the present technique to be described below and a method for manufacturing a surface-emitting laser of a twelfth embodiment to be described below unless there is a particular technical contradiction.

5. Fourth Embodiment (Example 4 of Surface-Emitting Laser)

A surface-emitting laser of a fourth embodiment (example 4 of a surface-emitting laser) according to the present technique will be described with reference to FIG. 4.

Figure 4:
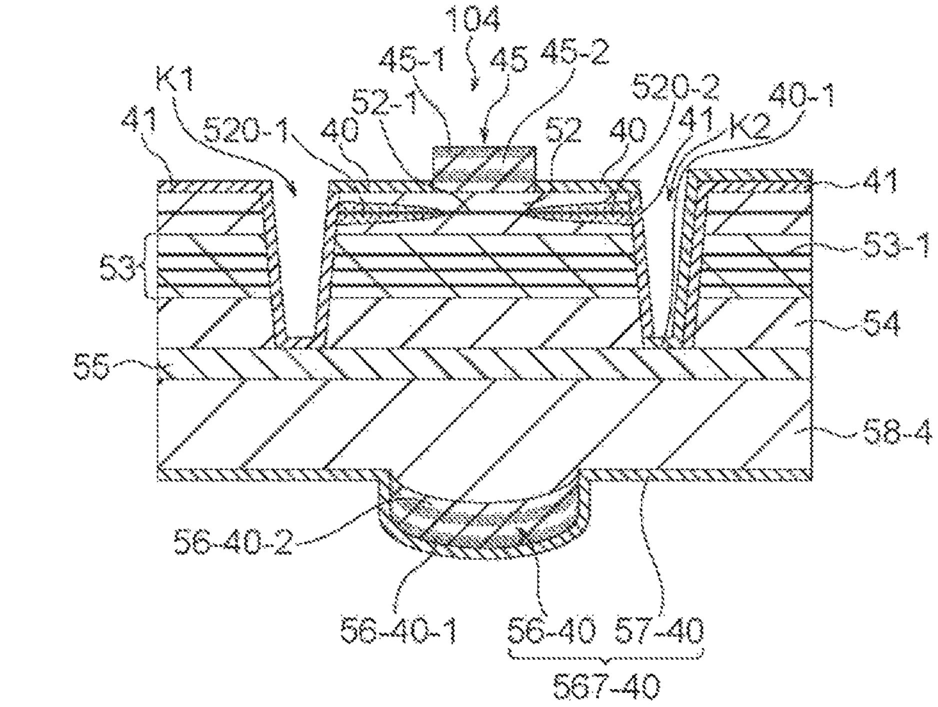
FIG. 4 is a diagram illustrating a configuration example of a surface-emitting laser of a fourth embodiment to which the present technique is applied.

FIG. 4 is a diagram illustrating a configuration example of the surface-emitting laser of the fourth embodiment according to the present technique, and specifically, is a cross-sectional view illustrating a surface-emitting laser 104.

The surface-emitting laser 104 includes a substrate 58-4 and a vertical resonator structure formed on the substrate 58-4. The vertical resonator structure includes at least one element selected from the group consisting of In, Ga, Al, N, As, and P, and includes at least an active layer 53, an upper DBR layer 45, a lower DBR layer, an upper electrode 40, and a lower electrode 40-1. The lower DBR layer includes an ITiO layer 55.

The surface-emitting laser 104 illustrated in FIG. 4 includes a concave lens mirror 567-40 that is formed below the substrate 58-4 as a confinement method. The concave lens mirror 567-40 may contain a material such as a resin, an oxide film or the like other than the lens processing to the substrate 58-4.

As described above, the content described for the surface-emitting laser of the fourth embodiment (example 4 of the surface-emitting laser) according to the present technique can be applied to the surface-emitting lasers of the first to third embodiments according to the present technique described above, surface-emitting lasers of fifth to eleventh embodiments according to the present technique to be described below and a method for manufacturing a surface-emitting laser of a twelfth embodiment to be described below unless there is a particular technical contradiction.

6. Fifth Embodiment (Example 5 of Surface-Emitting Laser)

A surface-emitting laser of a fifth embodiment (example 5 of a surface-emitting laser) according to the present technique will be described with reference to FIG. 5.

Figure 5:
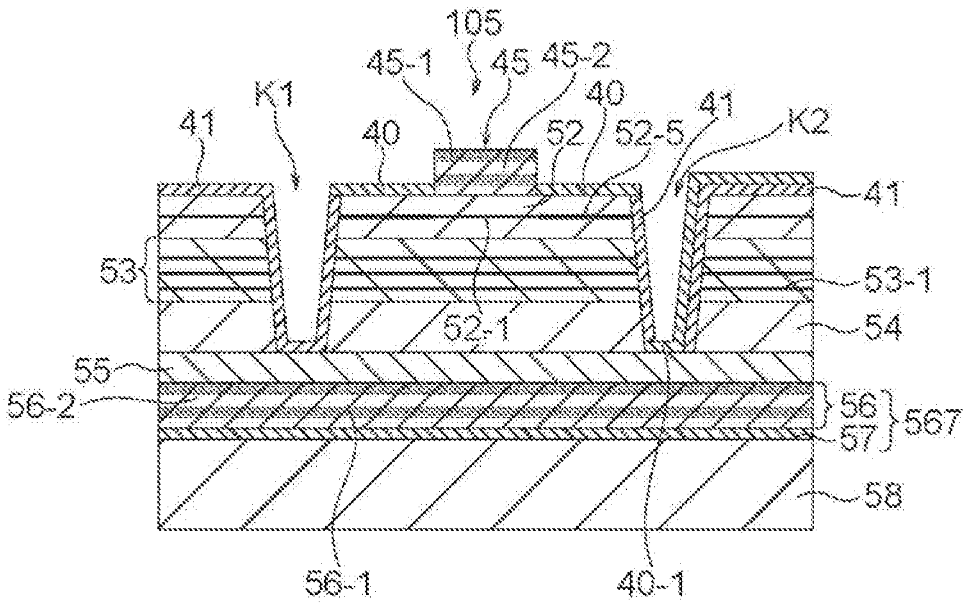
FIG. 5 is a diagram illustrating a configuration example of a surface-emitting laser of a fifth embodiment to which the present technique is applied.

FIG. 5 is a diagram illustrating a configuration example of the surface-emitting laser of the fifth embodiment according to the present technique, and specifically, is a cross-sectional view illustrating a surface-emitting laser 105.

The surface-emitting laser 105 includes a substrate 58 and a vertical resonator structure formed on the substrate 58. The vertical resonator structure includes at least one element selected from the group consisting of In, Ga, Al, N, As, and P, and includes at least an active layer 53, an upper DBR layer 45, a lower DBR layer, an upper electrode 40, and a lower electrode 40-1. The lower DBR layer includes a hybrid mirror 567 and an ITiO layer 55 in this order from the side of the substrate 58.

The surface-emitting laser 105 illustrated in FIG. 5 includes an oxide confinement structure 52-5 in the upper cladding layer 52 as a confinement method. The oxide confinement structure (oxide confinement layer) contains InAlAs or the like. Specifically, an InAlAs layer is formed at the center portion of the oxide confinement structure, and an InAlAsOx layer is formed at both end portions of the oxide confinement structure. Examples of the forming method thereof include, for example, steam oxidation. With this oxide confinement structure, current flows only in the InAlAs layer.

As described above, the content described for the surface-emitting laser of the fifth embodiment (example 5 of the surface-emitting laser) according to the present technique can be applied to the surface-emitting lasers of the first to fourth embodiments according to the present technique described above, surface-emitting lasers of sixth to eleventh embodiments according to the present technique to be described below and a method for manufacturing a surface-emitting laser of a twelfth embodiment to be described below unless there is a particular technical contradiction.

7. Sixth Embodiment (Example 6 of Surface-Emitting Laser)

A surface-emitting laser of a sixth embodiment (example 6 of a surface-emitting laser) according to the present technique will be described with reference to FIG. 6.

Figure 6:
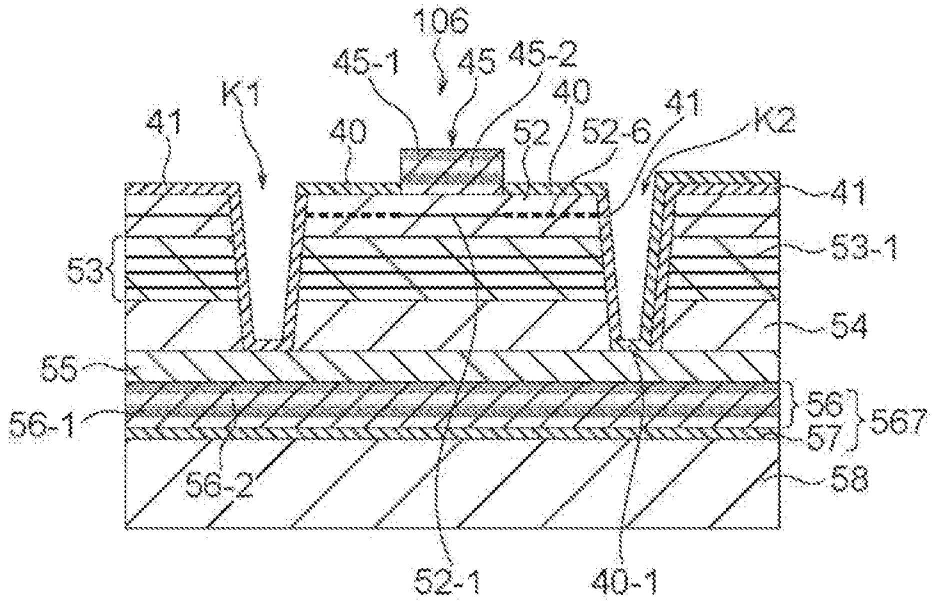
FIG. 6 is a diagram illustrating a configuration example of a surface-emitting laser of a sixth embodiment to which the present technique is applied.

FIG. 6 is a diagram illustrating a configuration example of the surface-emitting laser of the sixth embodiment according to the present technique, and specifically, is a cross-sectional view illustrating a surface-emitting laser 106.

The surface-emitting laser 106 includes a substrate 58 and a vertical resonator structure formed on the substrate 58. The vertical resonator structure includes at least one element selected from the group consisting of In, Ga, Al, N, As, and P, and includes at least an active layer 53, an upper DBR layer 45, a lower DBR layer, an upper electrode 40, and a lower electrode 40-1. The lower DBR layer includes a hybrid mirror 567 and an ITiO layer 55 in this order from the side of the substrate 58.

The surface-emitting laser 106 illustrated in FIG. 6 includes an air gap structure 52-6 in the upper cladding layer 52 as a confinement method. The air gap structure 52-6 is formed by side etching InAlAs via wet etching. Specifically, the InAlAs layer is formed at the center portion of the air gap structure 52-6, and Air is formed at both end portions of the air gap structure 52-6. With this air gap structure, current flows only in the InAlAs layer and a refractive index difference $\Delta n$ between InAlAs and Air is provided, so that a lateral optical confinement function is also added.

As described above, the content described for the surface-emitting laser of the sixth embodiment (example 6 of the surface-emitting laser) according to the present technique can be applied to the surface-emitting lasers of the first to fifth embodiments according to the present technique described above, surface-emitting lasers of seventh to eleventh embodiments according to the present technique to be described below and a method for manufacturing a surface-emitting laser of a twelfth embodiment to be described below unless there is a particular technical contradiction.

8. Seventh Embodiment (Example 7 of Surface-Emitting Laser)

A surface-emitting laser of a seventh embodiment (example 7 of a surface-emitting laser) according to the present technique will be described with reference to FIG. 7.

Figure 7:
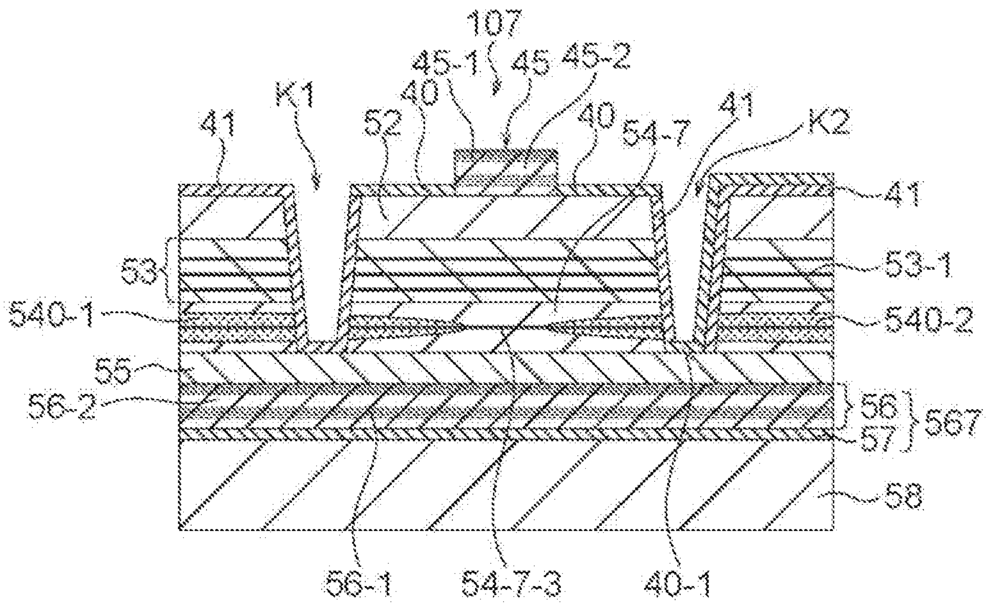
FIG. 7 is a diagram illustrating a configuration example of a surface-emitting laser of a seventh embodiment to which the present technique is applied.

FIG. 7 is a diagram illustrating a configuration example of the surface-emitting laser of the seventh embodiment according to the present technique, and specifically, is a cross-sectional view illustrating a surface-emitting laser 107.

The surface-emitting laser 107 includes a substrate 58 and a vertical resonator structure formed on the substrate 58. The vertical resonator structure includes at least one element selected from the group consisting of In, Ga, Al, N, As, and P, and includes at least an active layer 53, an upper DBR layer 45, a lower DBR layer, an upper electrode 40, and a lower electrode 40-1. The lower DBR layer includes a hybrid mirror 567 and an ITiO layer 55 in this order from the side of the substrate 58.

The surface-emitting laser 107 illustrated in FIG. 7 includes confinement structures 540-1 and 540-2 and a tunnel junction layer 54-7-3 that are formed in a lower cladding layer 54-7 (below the active layer 53). The confinement method is not particularly limited, and may be implantation, oxide confinement, air gap, burying, or the like.

As described above, the content described for the surface-emitting laser of the seventh embodiment (example 7 of the surface-emitting laser) according to the present technique can be applied to the surface-emitting lasers of the first to sixth embodiments according to the present technique described above, surface-emitting lasers of eighth to eleventh embodiments according to the present technique to be described below and a method for manufacturing a surface-emitting laser of a twelfth embodiment to be described below unless there is a particular technical contradiction.

9. Eighth Embodiment (Example 8 of Surface-Emitting Laser)

A surface-emitting laser of an eighth embodiment (example 8 of a surface-emitting laser) according to the present technique will be described with reference to FIG. 8.

Figure 8:
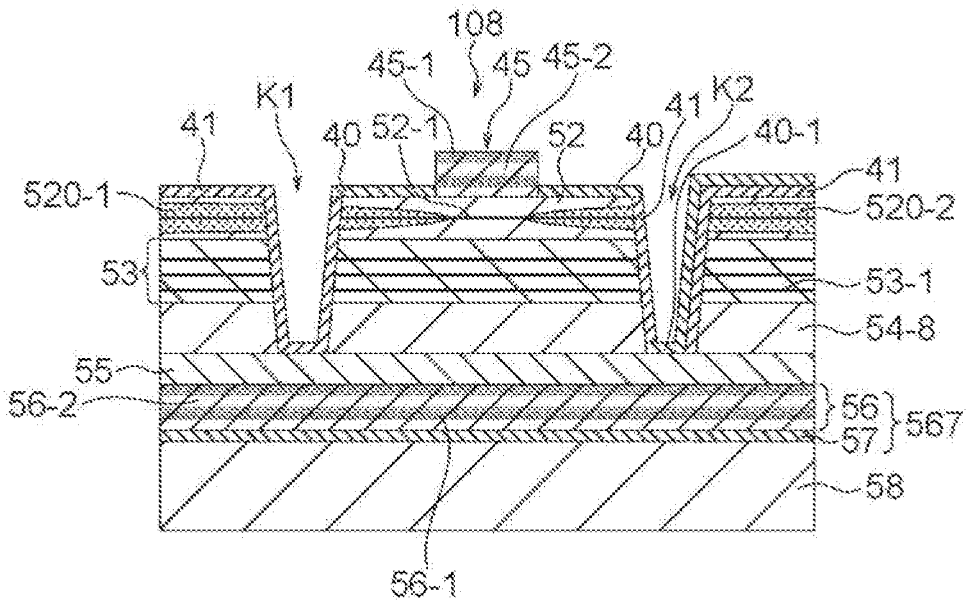
FIG. 8 is a diagram illustrating a configuration example of a surface-emitting laser of an eighth embodiment to which the present technique is applied.

FIG. 8 is a diagram illustrating a configuration example of the surface-emitting laser of the eighth embodiment according to the present technique, and specifically, is a cross-sectional view illustrating a surface-emitting laser 108.

The surface-emitting laser 108 includes a substrate 58 and a vertical resonator structure formed on the substrate 58. The vertical resonator structure includes at least one element selected from the group consisting of In, Ga, Al, N, As, and P, and includes at least an active layer 53, an upper DBR layer 45, a lower DBR layer, an upper electrode 40, and a lower electrode 40-1. The lower DBR layer includes a hybrid mirror 567 and an ITiO layer 55 in this order from the side of the substrate 58.

In the surface-emitting laser 108 illustrated in FIG. 8, a GaAs-based material is used for the active layer 53-8. Examples of the GaAs-based material used for the active layer 53-8 include InAsQDs, GaInNAs, InGaAs, AlGaInAs, InGaAsP, or the like.

As described above, the content described for the surface-emitting laser of the eighth embodiment (example 8 of the surface-emitting laser) according to the present technique can be applied to the surface-emitting lasers of the first to seventh embodiments according to the present technique described above, surface-emitting lasers of ninth to eleventh embodiments according to the present technique to be described below and a method for manufacturing a surface-emitting laser of a twelfth embodiment to be described below unless there is a particular technical contradiction.

10. Ninth Embodiment (Example 9 of Surface-Emitting Laser)

A surface-emitting laser of a ninth embodiment (example 9 of a surface-emitting laser) according to the present technique will be described with reference to FIG. 9.

Figure 9:
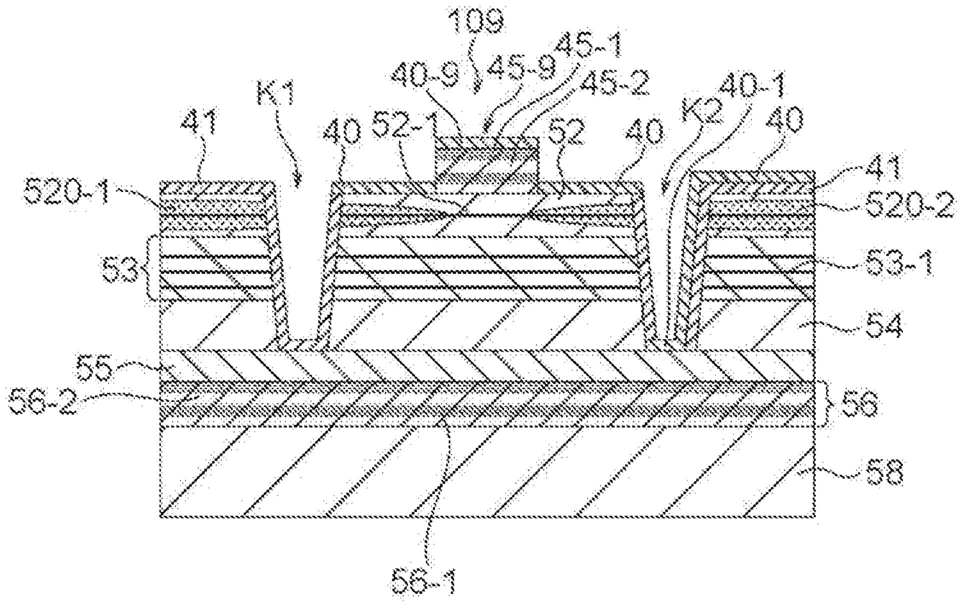
FIG. 9 is a diagram illustrating a configuration example of a surface-emitting laser of a ninth embodiment to which the present technique is applied.

FIG. 9 is a diagram illustrating a configuration example of the surface-emitting laser of the ninth embodiment according to the present technique, and specifically, is a cross-sectional view illustrating a surface-emitting laser 109.

The surface-emitting laser 109 includes a substrate 58 and a vertical resonator structure formed on the substrate 58. The vertical resonator structure includes at least one element selected from the group consisting of In, Ga, Al, N, As, and P, and includes at least an active layer 53, an upper DBR layer 45-9, a lower DBR layer, an upper electrode 40, and a lower electrode 40-1. The lower DBR layer includes a dielectric layer 56 and an ITiO layer 55 in this order from the side of the substrate 58. In the upper DBR layer 45-9, a $SiO_2$ layer 45-2, a $TiO_2$ layer 45-1, another $SiO_2$ layer 45-2 and another $TiO_2$ layer 45-1 are laminated in this order from the side of the substrate 58 (upper cladding layer 52), and a metal layer 40-9, which contains the same material as the upper electrode 40, is further laminated on the $TiO_2$ layer 45-1.

In the surface-emitting laser 109 illustrated in FIG. 9, the light is emitted from the side of the substrate (for example, Si substrate) 58 as its emission direction, which is different from the emission direction of the surface-emitting lasers of the first to eighth embodiments (the surface-emitting lasers 101 to 108). Note that, in addition to the Si substrate, a substrate (layer) containing GaAs (including epitaxial DBR) or the like may be used.

As described above, the content described for the surface-emitting laser of the ninth embodiment (example 9 of the surface-emitting laser) according to the present technique can be applied to the surface-emitting lasers of the first to eighth embodiments according to the present technique described above, surface-emitting lasers of tenth and eleventh embodiments according to the present technique to be described below and a method for manufacturing a surface-emitting laser of a twelfth embodiment to be described below unless there is a particular technical contradiction.

11. Tenth Embodiment (Example 10 of Surface-Emitting Laser)

A surface-emitting laser of a tenth embodiment (example 10 of a surface-emitting laser) according to the present technique will be described with reference to FIG. 10.

Figure 10:
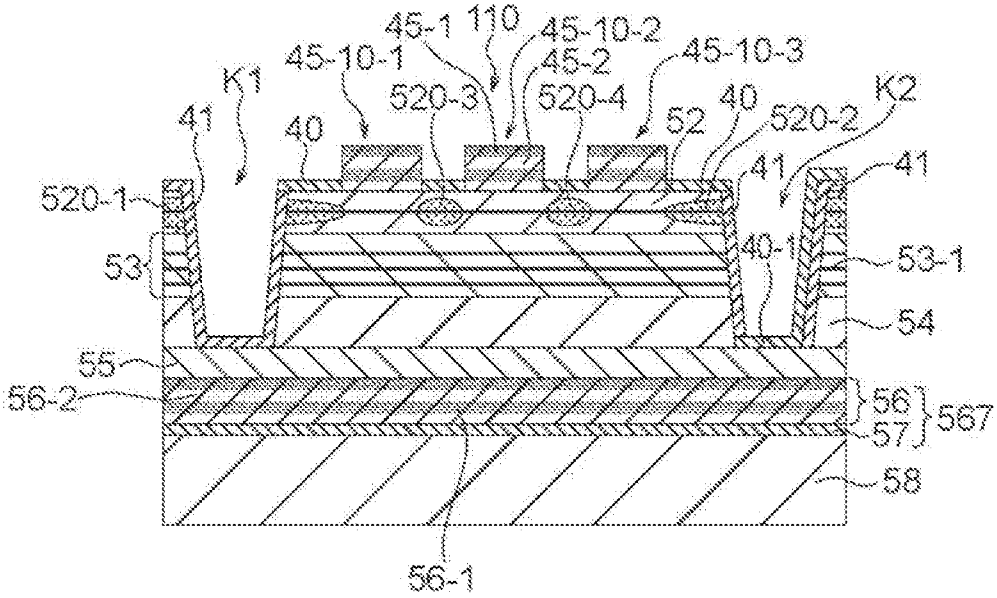
FIG. 10 is a diagram illustrating a configuration example of a surface-emitting laser of a tenth embodiment to which the present technique is applied.

FIG. 10 is a diagram illustrating a configuration example of the surface-emitting laser of the tenth embodiment according to the present technique, and specifically, is a cross-sectional view illustrating a surface-emitting laser 110.

The surface-emitting laser 110 includes a substrate 58 and a vertical resonator structure formed on the substrate 58. The vertical resonator structure includes at least one element selected from the group consisting of In, Ga, Al, N, As, and P, and includes at least an active layer 53, three upper DBR layers 45-10-1 to 45-10-3, a lower DBR layer, an upper electrode 40, and a lower electrode 40-1. The lower DBR layer includes a hybrid mirror 567 and an ITiO layer 55 in this order from the side of the substrate 58. Current confinement structures 520-1, 520-2, 520-3, and 520-4 are formed in regions outside the lower regions of the respective upper DBR layers 45-10-1 to 45-10-3.

As will be appreciated, the number of the upper DBR layers is not limited to three, although three upper DBR layers 45-10-1 to 45-10-3 are illustrated in FIG. 10. In the surface-emitting laser 110, each of three (a plurality of) upper DBR layers is formed in an array as a surface-emitting laser element. In the surface-emitting laser 110, a concave lens mirror may be formed as a confinement method. Alternatively, another confinement method (for example, implantation, oxide confinement, air gap, burying, or the like) may be applied.

As described above, the content described for the surface-emitting laser of the tenth embodiment (example of the surface-emitting laser) according to the present technique can be applied to the surface-emitting lasers of the first to ninth embodiments according to the present technique described above, a surface-emitting laser of eleventh embodiment according to the present technique to be described below and a method for manufacturing a surface-emitting laser of a twelfth embodiment to be described below unless there is a particular technical contradiction.

12. Eleventh Embodiment (Example 11 of Surface-Emitting Laser)

A surface-emitting laser of an eleventh embodiment (example 11 of a surface-emitting laser) according to the present technique will be described with reference to FIG. 11.

Figure 11:
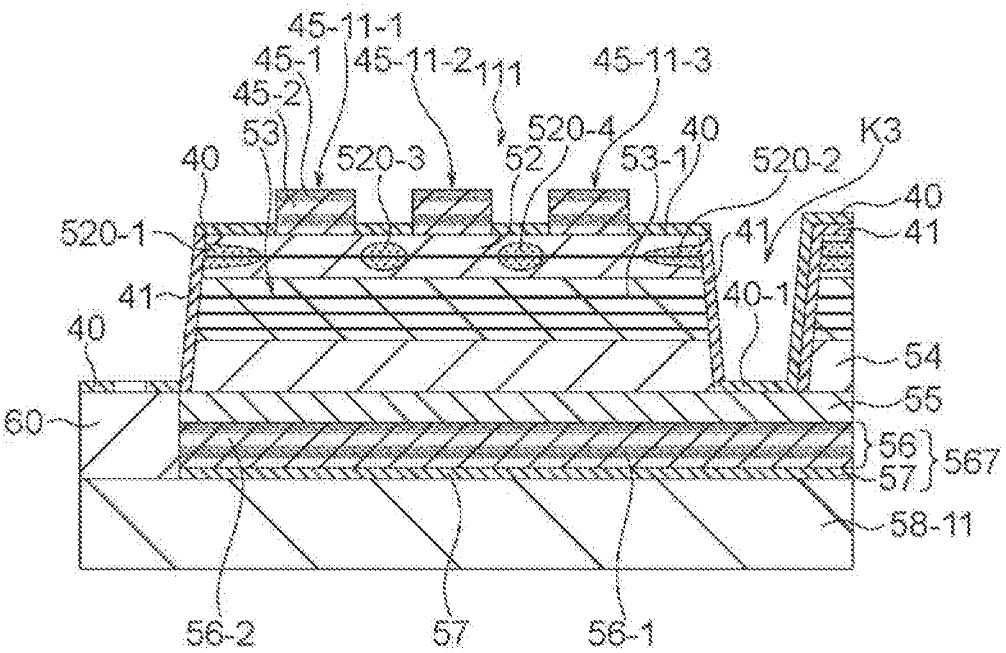
FIG. 11 is a diagram illustrating a configuration example of a surface-emitting laser of an eleventh embodiment to which the present technique is applied.

FIG. 11 is a diagram illustrating a configuration example of the surface-emitting laser of the eleventh embodiment according to the present technique, and specifically, is a cross-sectional view illustrating a surface-emitting laser 111.

The surface-emitting laser 111 includes a Si circuit substrate 58-11 and a vertical resonator structure formed on the Si circuit substrate 58-11. The vertical resonator structure includes at least one element selected from the group consisting of In, Ga, Al, N, As, and P, and includes at least an active layer 53, three upper DBR layers 45-11-1 to 45-11-3, a lower DBR layer, an upper electrode 40, and a lower electrode 40-1. The lower DBR layer includes a hybrid mirror 567 and an ITiO layer 55 in this order from the side of the substrate 58. Current confinement structures 520-1, 520-2, 520-3, and 520-4 are formed in regions outside the lower regions of the respective upper DBR layers 45-11-1 to 45-11-3. Note that, in the above description, the number of upper DBR layers is 3 (45-11-1 to 45-11-3), but the number of the upper DBR layers is not limited thereto.

The surface-emitting laser 111 illustrated in FIG. 11 is a modular VCSEL including a Si circuit substrate 58-11, and specifically, a time of flight (TOF) module in which a photodiode (PD) 60 containing SiGe having long wavelength sensitivity is an avalanche photodiode (APD). The surface-emitting laser 111, which is an independently driven VCSEL, can be applied to the technical field of silicon photonics.

As described above, the content described for the surface-emitting laser of the eleventh embodiment (example 11 of the surface-emitting laser) according to the present technique can be applied to the surface-emitting lasers of first to tenth embodiments according to the present technique described above and a method for manufacturing a surface-emitting laser of a twelfth embodiment to be described below unless there is a particular technical contradiction.

13. Twelfth Embodiment (Example 1 of Method for Manufacturing Surface-Emitting Laser)

A method for manufacturing a surface-emitting laser of a twelfth embodiment (example 1 of a method for manufacturing a surface-emitting laser) according to the present technique will be described with reference to FIGS. 12 to 17.

Figure 15:
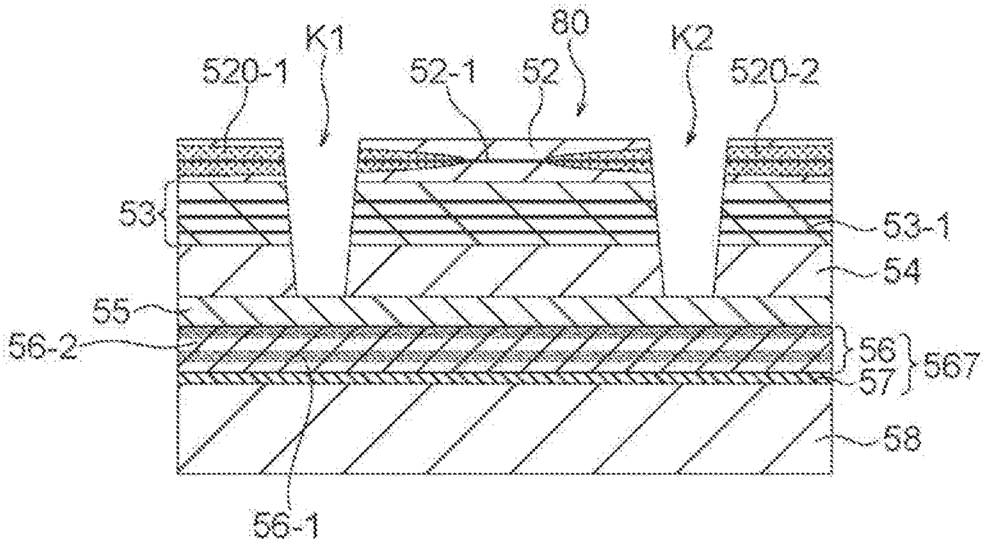
FIG. 15 is a diagram for describing the method for manufacturing the surface-emitting laser of the twelfth embodiment to which the present technique is applied.
Figure 15:
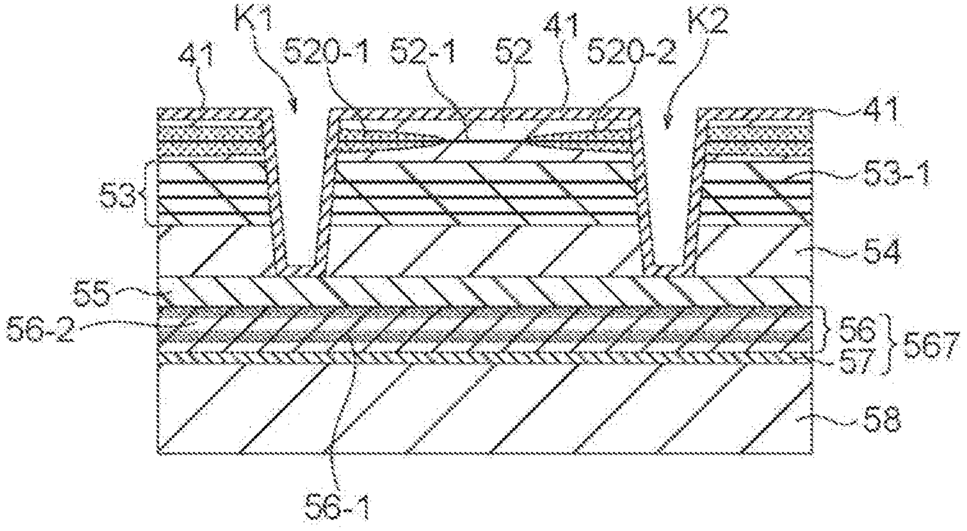
Figure 16:
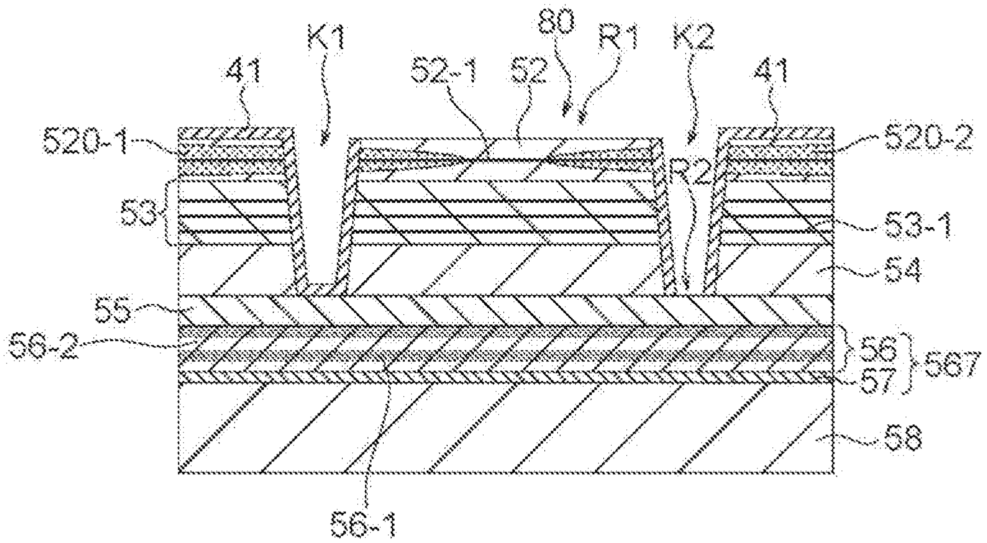
FIG. 16 is a diagram for describing the method for manufacturing the surface-emitting laser of the twelfth embodiment to which the present technique is applied.
Figure 16:
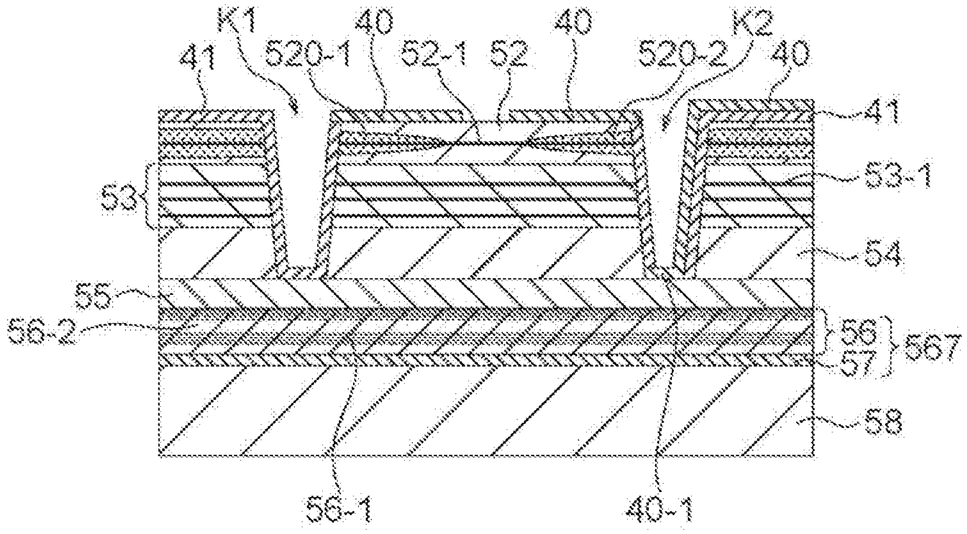
Figure 17:
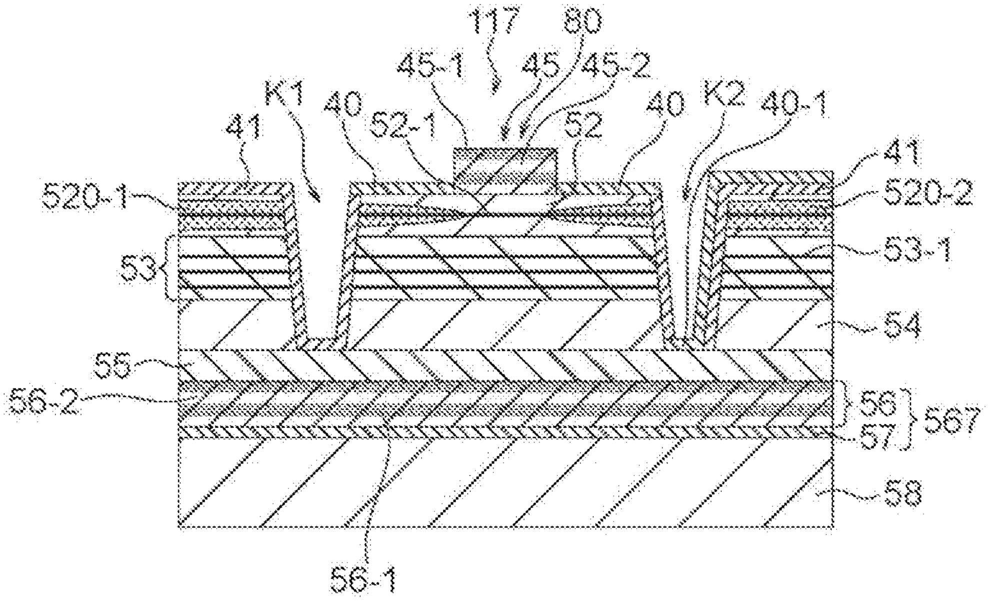
FIG. 17 is a diagram illustrating a configuration example of a surface-emitting laser manufactured according to the method for manufacturing the surface-emitting laser of the twelfth embodiment to which the present technique is applied.

FIGS. 12 to 16 are diagrams for describing the method for manufacturing the surface-emitting laser of the twelfth embodiment according to the present technique. FIG. 17 is a diagram illustrating a configuration example of the surface-emitting laser manufactured according to the method for manufacturing the surface-emitting laser of the twelfth embodiment according to the present technique, and specifically, is a cross-sectional view illustrating a surface-emitting laser 117.

Figure 12:
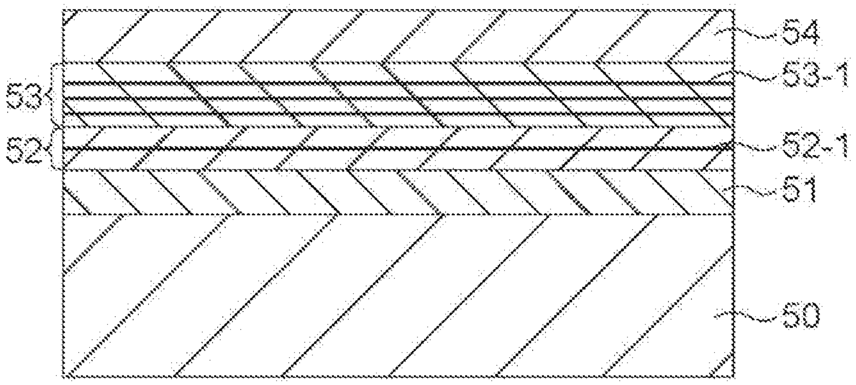
FIG. 12 is a diagram for describing a method for manufacturing a surface-emitting laser of a twelfth embodiment to which the present technique is applied.
Figure 12:
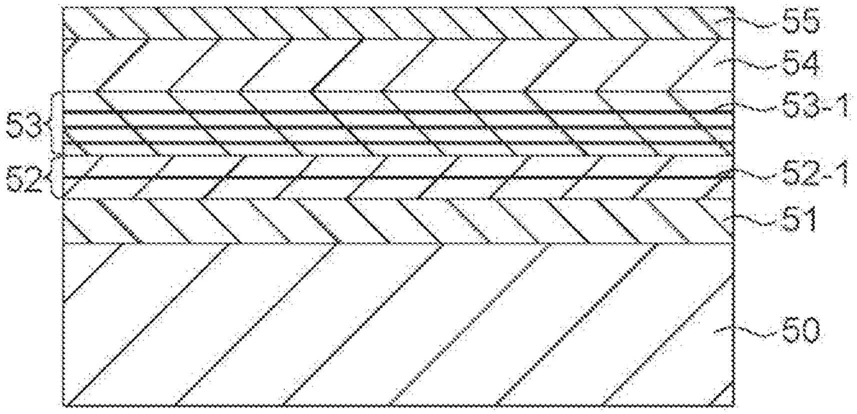

First, description will be made with reference to FIG. 12.

As illustrated in FIG. 12A, an active layer 53, a tunnel junction layer 52-1, and two cladding layers (a lower cladding layer 52 and an upper cladding layer 54 (for example, layer including InP)) are epitaxially formed on an InP substrate 50. At this time, the active layer may include InGaAsP, AlGaInAs, InAsQDs, and the like. In addition, an etching stop layer 51 (for example, a layer including InGaAsP) is formed to release the InP substrate 50.

As illustrated in FIG. 12B, an ITiO layer 55, which is a transparent conductive film, is formed on an epitaxial outermost surface layer (cladding layer 54) via a sputtering method. At this time, the film thickness of the ITiO layer 55 may be, for example, λ/4 n.

Figure 13:
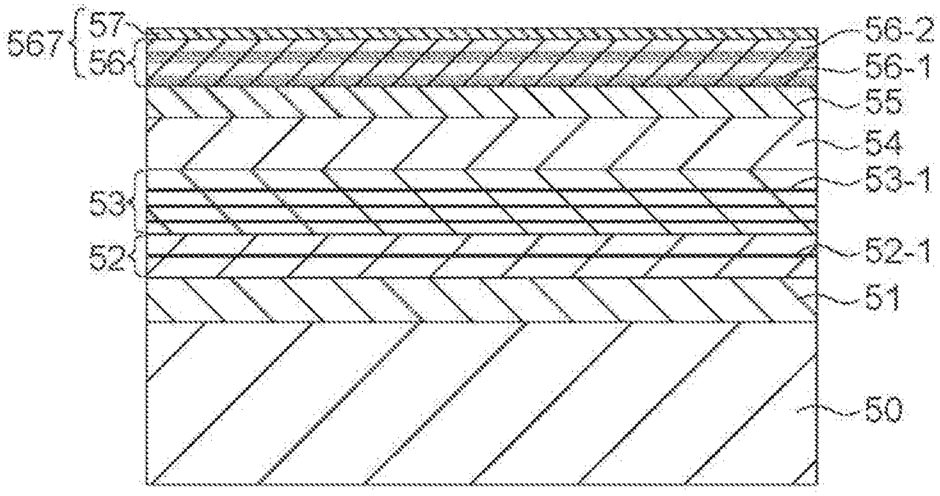
FIG. 13 is a diagram for describing the method for manufacturing the surface-emitting laser of the twelfth embodiment to which the present technique is applied.
Figure 13:
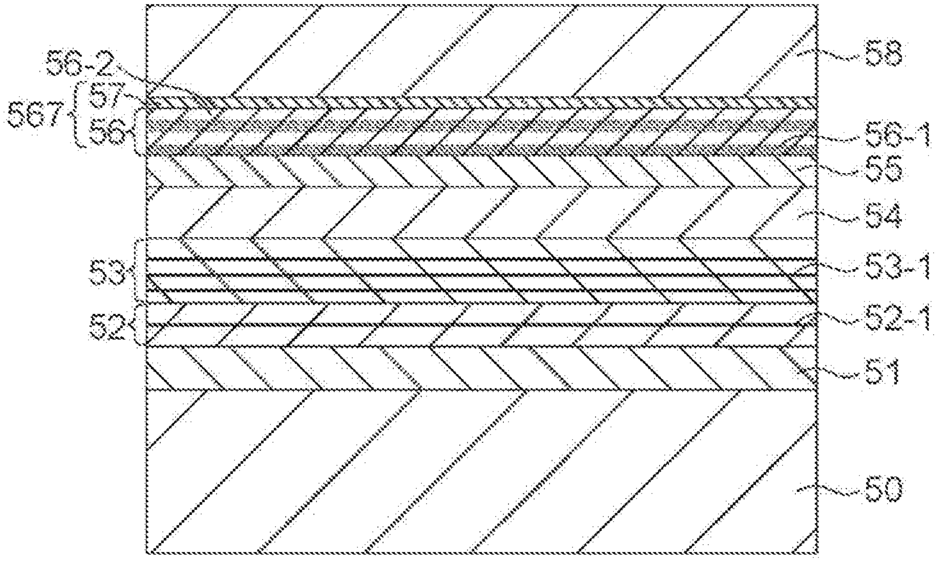

Description will be made with reference to FIG. 13.

As illustrated in FIG. 13A, a hybrid mirror 567 is formed on the ITiO 55. The hybrid mirror 567 includes a $TiO_2$ layer 56-1, a $SiO_2$ layer 56-2, another $TiO_2$ layer 56-1, another $SiO_2$ layer 56-2 (that is, dielectric layer 56), and a metal layer (Au layer) 57 in this order from the side of the ITiO layer 55. At this time, the ITiO layer 55 constitutes the first layer of the layers in the lower DBR layer (lower DBR mirror). Alternatively, the dielectric material may be a-Si or $Ta_2O_5$, and the metal may be a laminated film of Ag or Ag/Au. Note that, in FIG. 13A, respective two $TiO_2$ layers and two $SiO_2$ layers are included, but it is not limited thereto, and for example, respective three or more $TiO_2$ layers and $SiO_2$ layers may be included.

As illustrated in FIG. 13B, the support substrate 58 (for example, Si substrate) is bonded to the hybrid mirror 567. At this time, the bonding method may be Au eutectic bonding or room-temperature plasma bonding.

Figure 14:
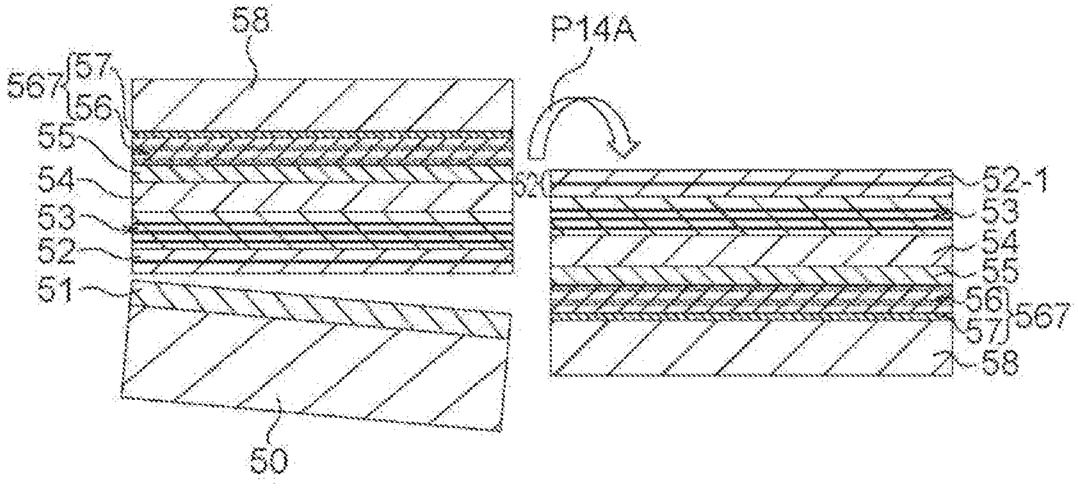
FIG. 14 is a diagram for describing the method for manufacturing the surface-emitting laser of the twelfth embodiment to which the present technique is applied.
Figure 14:
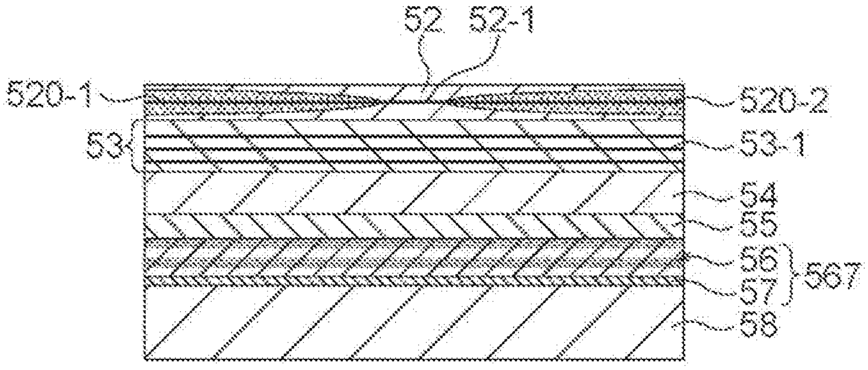

Description will be made with reference to FIG. 14.

As illustrated in FIG. 14A, the InP substrate 50 is ground with a back grinder, and the etching stop layer 51 is removed via wet etching. At this time, mixed chemical solution including at least two selected from the group consisting of HCl, $H_3PO_4$, $H_2SO_4$, $H_2O_2$, and $H_2O$ are used. Then, the substrate is turned over in the direction of an arrow P14A such that the support substrate 58 (for example, Si substrate) is on the lower side.

As illustrated in FIG. 14B, for example, ion implantation is performed with a resist pattern formed via photolithography to form the current confinement structures 520-1 and 520-2, At this time, H, O, B, or the like may be injected.

Description will be made with reference to FIG. 15.

As illustrated in FIG. 15A, for example, the semiconductor layer is etched up to the ITiO layer 55 using a C12 dry etcher with a resist pattern formed via photolithography to create two openings K1 and K2 to form a mesa 80. At this time, mixed gas including at least two selected from the group consisting of $Cl_2$, $BCl_3$, $SiCl_4$, Ar, and $O_2$ are used.

As illustrated in FIG. 15B, for example, a SiN film 41 is formed via a CVD method to form a protective film. Note that a $SiO_2$ film may be used instead of the SiN film 41.

Description will be made with reference to FIG. 16. As illustrated in FIG. 16A, for example, the protective film is opened using a dry etcher with a resist pattern formed via photolithography (the upper portion R1 of the mesa 80 and the bottom portion R2 of the opening K2) to form the electrode. At this time, $CF_4$ is used.

As illustrated in FIG. 16B, in order to form electrodes on the upper and lower portions, for example, a metal is vapor-deposited with a resist pattern formed via photolithography, thereby forming the upper electrode 40 and the lower electrode 40-1. At this time, the upper electrode 40 and the lower electrode 40-1 contains Ti/Pt/Au. Alternatively, the upper electrode 40 and the lower electrode 40-1 may contain AuGe/Ni/Au.

Description will be made with reference to FIG. 17.

As illustrated in FIG. 17, the upper DBR layer 45 that contains a dielectric is formed on the mesa 80. Lift-off may be performed using a resist pattern. Alternatively, the upper portion of the mesa 80 may be left by opening the upper DBR layer 45. In the upper DBR layer 45, a $SiO_2$ layer 45-2, a $TiO_2$ layer 45-1, another $SiO_2$ layer 45-2 and another $TiO_2$ layer 45-1 are laminated in this order from the side of the substrate 58 (upper cladding layer 52). The number of pairs of $SiO_2$ layer/$TiO_2$ layer is preferably at least two. The film thickness of each of the $SiO_2$ layer and the $TiO_2$ layer is λ/4n (λ represents an emission (oscillation) wavelength of the surface-emitting laser, and n represents a refractive index of $SiO_2$ or $TiO_2$). Note that the upper DBR layer may include a-Si and/or $Ta_2O_5$.

As described above, the intracavity surface-emitting laser (VCSEL) 117 in which the transparent conductive film (ITiO layer 55) is disposed between the substrate 58 and the active layer 53 is completed.

As described above, the content described for the surface-emitting laser element array of the twelfth embodiment (example 1 of the method for manufacturing the surface-emitting laser) according to the present technique can be applied to the surface-emitting lasers of the first to eleventh embodiments according to the present technique described above unless there is a particular technical contradiction.

Note that the embodiments according to the present technique are not limited to the above-described embodiments, and various modifications can be made without departing from the gist of the present technique.

In addition, the effects described in the present specification are merely illustrative and not restrictive, and may have additional effects.

Furthermore, the present technique can also have the following configurations.

[1]

A surface-emitting laser including a substrate, and a vertical resonator structure formed on the substrate, in which the vertical resonator structure includes at least one element selected from a group consisting of In, Ga, Al, N, As, and P, and includes at least an active layer, an upper DBR layer, and a lower DBR layer, the upper DBR layer and the lower DBR layer are formed with the active layer interposed therebetween, and the lower DBR layer includes at least one transparent conductive layer that contains a transparent conductive material including a non III-V semiconductor.

[2]

The surface-emitting laser according to [1], in which the transparent conductive layer is transparent to an emission wavelength.

[3]

The surface-emitting laser according to [1] or [2], in which the transparent conductive layer has a film thickness of λ/4n (λ is an emission wavelength, and n is a refractive index of the transparent conductive material), and the transparent conductive material includes ITio, ITO, ZnO, AZO, or IGZO.

[4]

The surface-emitting laser according to any one of [1] to [3], in which the lower DBR layer further includes a metal layer and a dielectric layer in this order from a side of the substrate.

[5]

The surface-emitting laser according to any one of [1] to [3], in which the lower DBR layer further includes a metal layer and a dielectric layer in this order from a side of the substrate, the dielectric layer is formed by alternately laminating a first dielectric layer and a second dielectric layer, and the first dielectric layer contains a first dielectric material, the second dielectric layer contains a second dielectric material, the first dielectric layer has a film thickness of λ/4n1 (λ is an emission wavelength, and n1 is a refractive index of the first dielectric material), and the second dielectric layer has a film thickness of λ/4n2 (λ is an emission wavelength, and n2 is a refractive index of the second dielectric material).

[6]

The surface-emitting laser according to any one of [1] to [3], in which the lower DBR layer further includes a semiconductor epitaxial layer.

[7]

The surface-emitting laser according to any one of [1] to [6], in which an oxide confinement structure is formed in a region between the upper DBR layer and the active layer and outside a lower region of the upper DBR layer.

[8]

The surface-emitting laser according to any one of [1] to [7], in which a current confinement structure via tunnel junction is formed in a region between the upper DBR layer and the active layer and outside a lower region of the upper DBR layer.

[9]

The surface-emitting laser according to any one of [1] to [8], in which a current confinement structure via ion implantation is formed in a region between the upper DBR layer and the active layer and outside a lower region of the upper DBR layer.

[10]

The surface-emitting laser according to any one of [1] to [9], in which an optical confinement structure is formed under the substrate, and the optical confinement structure includes a concave mirror.

[11]

The surface-emitting laser according to any one of [1] to [10], in which an oxide confinement structure, a current confinement structure via tunnel junction, or a current confinement structure via ion implantation is formed in a region between the active layer and the lower DBR layer and outside a lower region of the upper DBR layer.

[12]

The surface-emitting laser according to any one of [1] to [11], in which the active layer includes a III-V semiconductor.

[13]

The surface-emitting laser according to any one of [1] to [3] and [7] to [12], in which the lower DBR layer includes a dielectric layer, and the upper DBR layer includes a dielectric layer and a metal layer in this order from a side of the substrate.

[14]

The surface-emitting laser according to any one of [1] to [13], in which the vertical resonator structure includes a plurality of the upper DBR layers, and the plurality of DBR layers is formed in an array.

[15]

The surface-emitting laser according to any one of [1] to [14], in which the substrate includes a Si circuit substrate, and the surface-emitting laser is independently driven.

[16]

A surface-emitting laser including a substrate and vertical resonator structure formed on the substrate, in which the vertical resonator structure includes at least one element selected from a group consisting of In, Ga, Al, N, As, and P, and includes at least an active layer, an upper DBR layer, a lower DBR layer, an upper electrode, and a lower electrode, the upper DBR layer and the lower DBR layer are formed with the active layer interposed therebetween, the upper electrode and the lower electrode are formed with the active layer interposed therebetween, the lower DBR layer includes at least one transparent conductive layer that contains a transparent conductive material including a non III-V semiconductor, the transparent conductive layer includes a contact region in contact with the lower electrode, and the surface-emitting laser includes an intracavity structure.

[17]

The surface-emitting laser according to [16], in which the transparent conductive layer is transparent to an emission wavelength.

[18]

The surface-emitting laser according to or [17], in which the transparent conductive layer has a film thickness of λ/4n (λ is an emission wavelength, and n is a refractive index of the transparent conductive material), and the transparent conductive material includes ITio, ITO, ZnO, AZO, or IGZO.

[19]

The surface-emitting laser according to any one of [16] to [18], in which the lower DBR layer further includes a metal layer and a dielectric layer in this order from a side of the substrate.

[20]

The surface-emitting laser according to any one of [16] to [18], in which the lower DBR layer further includes a metal layer and a dielectric layer in this order from a side of the substrate side, the dielectric layer is formed by alternately laminating a first dielectric layer and a second dielectric layer, and the first dielectric layer contains a first dielectric material, the second dielectric layer contains a second dielectric material, the first dielectric layer has a film thickness of λ/4n1 (λ is an emission wavelength, and n1 is a refractive index of the first dielectric material), and the second dielectric layer has a film thickness of λ/4n2 (λ is an emission wavelength, and n2 is a refractive index of the second dielectric material).

[21]

The surface-emitting laser according to any one of [16] to [18], in which the lower DBR layer further includes a semiconductor epitaxial layer.

[22]

The surface-emitting laser according to any one of [16] to [21], in which an oxide confinement structure is formed in a region between the upper DBR layer and the active layer and outside a lower region of the upper DBR layer.

[23]

The surface-emitting laser according to any one of [16] to [22], in which a current confinement structure via tunnel junction is formed in a region between the upper DBR layer and the active layer and outside a lower region of the upper DBR layer.

[24]

The surface-emitting laser according to any one of [16] to [23], in which a current confinement structure via ion implantation is formed in a region between the upper DBR layer and the active layer and outside a lower region of the upper DBR layer.

[25]

The surface-emitting laser according to any one of [16] to [24], in which an optical confinement structure is formed under the substrate, and the optical confinement structure includes a concave mirror.

[26]

The surface-emitting laser according to any one of [16] to [25], in which an oxide confinement structure, a current confinement structure via tunnel junction, or a current confinement structure via ion implantation is formed in a region between the active layer and the lower DBR layer and outside a lower region of the upper DBR layer.

[27]

The surface-emitting laser according to any one of [16] to [25], in which the active layer includes a III-V semiconductor.

[28]

The surface-emitting laser according to any one of [16] to [18] and [22] to [27], in which the lower DBR layer includes a dielectric layer, and the upper DBR layer includes a dielectric layer and a metal layer in this order from a side of the substrate.

[29]

The surface-emitting laser according to any one of [16] to [28], in which the vertical resonator structure includes a plurality of the upper DBR layers, and the plurality of DBR layers is formed in an array.

[30]

The surface-emitting laser according to any one of [16] to [29], in which the substrate includes a Si circuit substrate, and the surface-emitting laser is independently driven.

[31]

A method for manufacturing a surface-emitting laser including forming a first substrate provided with an active layer, forming, on the first substrate, a lower DBR layer including at least a transparent conductive layer containing a transparent conductive material that transmits light of a specific wavelength and a dielectric layer containing a dielectric material, bonding a second substrate to the lower DBR layer, and removing the first substrate to form an upper DBR layer including at least a confinement structure, an electrode structure, and a dielectric layer containing a dielectric material.

REFERENCE SIGNS LIST

45 Upper DBR layer
52 Upper cladding layer
53 Active layer
54 Lower cladding layer
55 Transparent conductive layer (ITio layer)
56 Dielectric layer
57 Metal layer (Au layer)
58 Substrate
101, 102, 103, 104, 105, 106, 107, 108, 109, 110, 111, 117 Surface-emitting laser
567 Hybrid mirror

The invention claimed is:

1. A surface-emitting laser comprising:

a substrate; and a vertical resonator structure formed on the substrate, wherein the vertical resonator structure includes at least one element selected from a group consisting of In, Ga, Al, N, As, and P, and includes at least an active layer, an upper DBR layer, and a lower DBR layer, the upper DBR layer and the lower DBR layer are formed with the active layer interposed therebetween, the lower DBR layer includes at least one transparent conductive layer that contains a transparent conductive material including a non III-V semiconductor, the lower DBR layer includes a metal layer and a dielectric layer in this order from a side of the substrate, the dielectric layer is formed by alternately laminating a first dielectric layer and a second dielectric layer, the first dielectric layer contains a first dielectric material, the second dielectric layer contains a second dielectric material, the first dielectric layer has a film thickness of λ/4n1 (λ is an emission wavelength, and n1 is a refractive index of the first dielectric material), and the second dielectric layer has a film thickness of λ/4n2 (λ is an emission wavelength, and n2 is a refractive index of the second dielectric material).

2. The surface-emitting laser according to claim 1, wherein the transparent conductive layer is transparent to an emission wavelength.

3. The surface-emitting laser according to claim 1, wherein the transparent conductive layer has a film thickness of λ/4n (λ is an emission wavelength, and n is a refractive index of the transparent conductive material), and the transparent conductive material includes ITiO, ITO, ZnO, AZO, or IGZO.

4. The surface-emitting laser according to claim 1, wherein the metal layer consists of Au.

5. The surface-emitting laser according to claim 1, wherein an oxide confinement structure is formed in a region between the upper DBR layer and the active layer and outside a lower region of the upper DBR layer.

6. The surface-emitting laser according to claim 1, wherein a current confinement structure via tunnel junction is formed in a region between the upper DBR layer and the active layer and outside a lower region of the upper DBR layer.

7. The surface-emitting laser according to claim 1, wherein a current confinement structure via ion implantation is formed in a region between the upper DBR layer and the active layer and outside a lower region of the upper DBR layer.

8. The surface-emitting laser according to claim 1, wherein an optical confinement structure is formed under the substrate, and the optical confinement structure includes a concave mirror.

9. The surface-emitting laser according to claim 1, wherein an oxide confinement structure, a current confinement structure via tunnel junction, or a current confinement structure via ion implantation is formed in a region between the active layer and the lower DBR layer and outside a lower region of the upper DBR layer.

10. The surface-emitting laser according to claim 1, wherein the active layer includes a III-V semiconductor.

11. The surface-emitting laser according to claim 1, wherein the vertical resonator structure includes a plurality of the upper DBR layers, and the plurality of DBR layers is formed in an array.

12. The surface-emitting laser according to claim 1, wherein the substrate includes a Si circuit substrate, and the surface-emitting laser is independently driven.

13. The surface-emitting laser according to claim 1, wherein the metal layer contains at least one of Au, Ag, and a laminated film of Ag/Au.

14. The surface-emitting laser according to claim 1, wherein the transparent conductive layer contains ITiO.

15. The surface-emitting laser according to claim 1, wherein the first dielectric material is $TiO_2$ and the second dielectric material is $SiO_2$.

16. A surface-emitting laser comprising:

a substrate; and a vertical resonator structure formed on the substrate, wherein the vertical resonator structure includes at least one element selected from a group consisting of In, Ga, Al, N, As, and P, and includes at least an active layer, an upper DBR layer, a lower DBR layer, an upper electrode, and a lower electrode, the upper DBR layer and the lower DBR layer are formed with the active layer interposed therebetween, the upper electrode and the lower electrode are formed with the active layer interposed therebetween, the lower DBR layer includes at least one transparent conductive layer that contains a transparent conductive material including a non III-V semiconductor, wherein the lower DBR layer includes a metal layer and a dielectric layer in this order from a side of the substrate, the dielectric layer is formed by alternately laminating a first dielectric layer and a second dielectric layer, the first dielectric layer contains a first dielectric material, the second dielectric layer contains a second dielectric material, the first dielectric layer has a film thickness of $\lambda/4n1$ ($\lambda$ is an emission wavelength, and n1 is a refractive index of the first dielectric material), and the second dielectric layer has a film thickness of $\lambda/4n2$ ($\lambda$ is an emission wavelength, and n2 is a refractive index of the second dielectric material), the transparent conductive layer includes a contact region in contact with the lower electrode, and the surface-emitting laser includes an intracavity structure.

17. The surface-emitting laser according to claim 16, wherein the transparent conductive layer is transparent to an emission wavelength.

18. The surface-emitting laser according to claim 16, wherein the transparent conductive layer has a film thickness of $\lambda/4n$ ($\lambda$ is an emission wavelength, and n is a refractive index of the transparent conductive material), and the transparent conductive material includes ITIO, ITO, ZnO, AZO, or IGZO.

19. A method for manufacturing a surface-emitting laser comprising:

forming a first substrate provided with an active layer;

forming, on the first substrate, a lower DBR layer including at least a transparent conductive layer containing a transparent conductive material that transmits light of a specific wavelength, a dielectric layer containing a dielectric material, and a metal layer, wherein forming the dielectric layer includes alternately laminating a first dielectric layer containing a first dielectric material and a second dielectric layer containing a second dielectric material, the first dielectric layer has a film thickness of $\lambda/4n1$ ($\lambda$ is an emission wavelength, and n1 is a refractive index of the first dielectric material), and the second dielectric layer has a film thickness of $\lambda/4n2$ ($\lambda$ is an emission wavelength, and n2 is a refractive index of the second dielectric material);

bonding a second substrate to the lower DBR layer; and removing the first substrate to form an upper DBR layer including at least a confinement structure, an electrode structure, and a dielectric layer containing a dielectric material.

* * * * *